United States Patent
Moslehi et al.

[19]

[11] Patent Number: 6,039,848
[45] Date of Patent: *Mar. 21, 2000

[54] ULTRA-HIGH VACUUM APPARATUS AND METHOD FOR HIGH PRODUCTIVITY PHYSICAL VAPOR DEPOSITION.

[75] Inventors: Mehrdad M. Moslehi, Los Altos, Calif.; Cecil J. Davis, Greenville, Tex.; Dorian Heimanson, Rochester, N.Y.

[73] Assignee: CVC Products, Inc., Rochester, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/958,877

[22] Filed: Oct. 27, 1997

Related U.S. Application Data

[63] Continuation of application No. 08/677,893, Jul. 10, 1996, abandoned.

[60] Provisional application No. 60/000,980, Jul. 10, 1995.

[51] Int. Cl.[7] .............................. C23C 14/34; C23C 14/35
[52] U.S. Cl. ............................... 204/192.12; 204/298.07; 204/298.09; 204/298.12; 204/298.19; 204/298.2
[58] Field of Search ....................... 204/192.12, 298.07, 204/298.09, 298.12, 298.19, 298.2

[56] References Cited

U.S. PATENT DOCUMENTS

| | | | |
|---|---|---|---|
| 3,944,911 | 3/1976 | McKervey | 204/298 |
| 4,299,678 | 11/1981 | Meckel | 204/192 M |
| 4,407,708 | 10/1983 | Landau | 204/298.19 X |
| 4,444,643 | 4/1984 | Garrett | 204/298.2 |
| 4,461,688 | 7/1984 | Morrison, Jr. | 204/192 R |
| 4,622,122 | 11/1986 | Landau | 204/298.19 |
| 4,631,106 | 12/1986 | Nakazato et al. | 156/345 |
| 4,657,654 | 4/1987 | Mintz | 204/298.12 |
| 4,673,482 | 6/1987 | Setoyama et al. | 204/298 |
| 4,872,964 | 10/1989 | Suzuki et al. | 204/298 |
| 5,079,481 | 1/1992 | Moslehi | 315/111.41 |
| 5,082,542 | 1/1992 | Moslehi et al. | 204/192.32 |
| 5,242,566 | 9/1993 | Parker | 204/298.2 |
| 5,252,194 | 10/1993 | Demaray et al. | 204/298.2 |
| 5,282,947 | 2/1994 | Brugge et al. | 204/298.2 |
| 5,320,728 | 6/1994 | Tepman | 204/192.12 |
| 5,328,585 | 7/1994 | Stevenson et al. | 204/298.2 |
| 5,354,443 | 10/1994 | Moslehi | 204/192.12 |
| 5,367,606 | 11/1994 | Moslehi et al. | 392/418 |
| 5,433,835 | 7/1995 | Demaray et al. | 204/298.2 X |
| 5,446,825 | 8/1995 | Moslehi et al. | 392/416 |
| 5,538,609 | 7/1996 | Hinterschuster et al. | 204/298.2 |

FOREIGN PATENT DOCUMENTS

| | | | |
|---|---|---|---|
| 0654543 | 11/1994 | European Pat. Off. | C23C 14/34 |
| 1177368 | 7/1989 | Japan | C23C 14/34 |
| 2125440 | 3/1984 | United Kingdom | C23C 15/00 |

OTHER PUBLICATIONS

PCT International Search Report; Mailing Date Dec. 31, 1996.

PCT International Search Report, Mailing Date Dec. 12, 1996.

*Primary Examiner*—Nam Nguyen
*Assistant Examiner*—Steven H. VerSteeg
*Attorney, Agent, or Firm*—Gray Cary Ware & Freidenrich, LLP

[57] ABSTRACT

A magnetron sputtering system is provided that uses a backing plate assembly having an insulating spacer ring coupled between and hermetically sealed to the backing plate and an extender ring. The insulating spacer ring can be constructed from a ceramic material, and the extender ring can be constructed from a metal material. The use of this backing plate assembly allows the backing plate assembly to be coupled directly to the chamber walls with a metal-to-metal contact, while the backing plate remains electrically isolated from the chamber walls. This allows the sealing of a vacuum chamber in the magnetron sputtering system using a seal suitable for creating an ultra-high vacuum in the vacuum chamber.

33 Claims, 3 Drawing Sheets

ULTRA-HIGH VACUUM APPARATUS AND METHOD FOR HIGH PRODUCTIVITY PHYSICAL VAPOR DEPOSITION.

CROSS REFERENCE TO RELATED APPLICATIONS

This application is a continuation of application Ser. No. 08/677,893, filed Jul. 10, 1996, now abandoned, which claimed priority to provisional application Ser. No. 60/000, 980 filed on Jul. 10, 1995.

TECHNICAL FIELD OF THE INVENTION

This invention relates in general to the field of magnetron sputtering systems, and more particularly to an ultra-high vacuum cathode apparatus and method for high productivity physical vapor deposition applications requiring extremely low vacuum base pressures.

BACKGROUND OF THE INVENTION

The deposition of films using a magnetron sputtering system provides enhanced deposition rates through the creation of a magnetic field at the target surface. It is advantageous to produce a high vacuum deposition environment within the vacuum chamber in the magnetron sputtering system. One limit to the creation of a high vacuum inside the vacuum chamber is the number and quality of seals between the vacuum chamber at the outside environment. Some seals can leak, thus preventing the formation of a high vacuum. Positioning and forming a seal suitable for a high vacuum can be problematic.

It is also advantageous in magnetron sputtering systems to increase the magnetic field strength at the target surface. This can be especially true when the target is a magnetic material. One barrier to the strength of the magnetic field is the thickness of the backing plate upon which the target is bonded. The backing plate serves the purpose of cooling the target and providing part of the chamber wall for forming the vacuum chamber for deposition of the target onto a substrate. In conventional systems, the backing plate experiences a pressure differential from the vacuum chamber to atmospheric pressure. This pressure differential places limits on the material properties of the backing plate.

Conventional systems have attempted to increase the magnetic field at the target using a number of methods. Some conventional systems have attempted to strengthen the magnetic field at the target by decreasing the thickness of the backing plate and using a center post to support the backing plate. However, bowing, deflection and buckling of the backing plate can still be caused by the pressure differential between the vacuum inside the chamber and pressure outside the chamber.

SUMMARY OF THE INVENTION

In accordance with the present invention, a high magnetic flux cathode apparatus and method for high productivity physical vapor deposition is provided that substantially eliminates or reduces disadvantages and problems associated with previously developed magnetron sputtering systems.

According to one embodiment of the present invention, a magnetron sputtering system is provided that uses a backing plate assembly having an insulating spacer ring coupled between a backing plate and an extender ring. The insulating spacer ring can be constructed from ceramic material, and the extender ring can be constructed from metal material. This backing plate assembly can be coupled directly to the chamber walls while the backing plate remains electrically isolated therefrom. This also allows the sealing of a vacuum chamber in the magnetron sputtering system using a seal suitable for creating an ultra-high vacuum in the vacuum chamber.

A technical advantage of the present invention is the use of an insulating spacer ring in the backing plate assembly such that the backing plate can be extended with a metal extender ring that contacts the chamber walls of the vacuum chamber. The backing plate remains electrically isolated from the chamber walls. The extension ring of the backing plate assembly allows the sealing of the vacuum chamber using a seal that can comprise a metal seal suitable for maintaining an ultrahigh vacuum inside the vacuum chamber.

BRIEF DESCRIPTION OF THE DRAWINGS

A more complete understanding of the present invention and advantages thereof may be acquired by reference to the following description taken in conjunction with the accompanying drawings in which like reference numbers indicate like features and wherein.

DETAILED DESCRIPTION OF THE INVENTION

Figure 1:
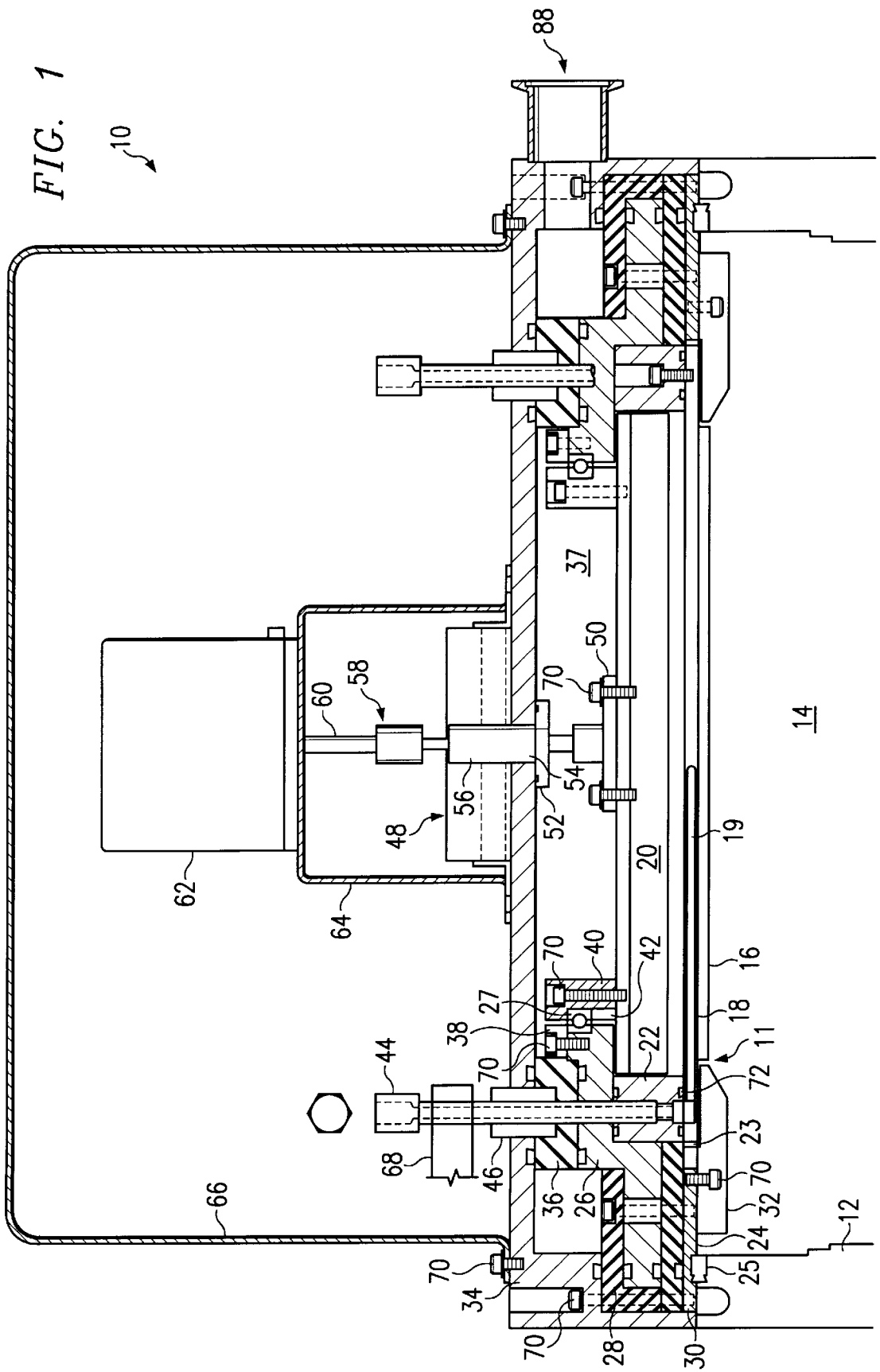
FIG. 1 is a cross-sectional view of one embodiment of a magnetron sputtering system, constructed according to the teachings of the present invention.

FIG. 1 is a cross-sectional view of a magnetron sputtering system, indicated generally at 10, constructed according to the teachings of the present invention. Magnetron sputtering system 10 is used to perform sputtering of a target material from a target onto a substrate in the vacuum chamber.

Chamber walls 12 define a vacuum deposition chamber 14. Chamber walls 12 are constructed from a metal material. A target 16 is positioned in chamber 14 and is mounted to a target backing plate assembly 11. Backing plate assembly 11 includes target backing plate 18, insulated spacer ring 23, and extender ring 24. Backing plate 18 should preferably be constructed from copper. The backing plate can also be constructed from other non-magnetic, electrically conductive metal materials such as 300 series stainless steel or from nickel plated aluminum.

Target 16 can be coupled to the backing plate 18 by means of a bonding process. The bonding process should preferably be a low-temperature (for example, less than 200 degrees Celcius) bonding process to allow de-bonding of the backing plate 18 from a used target 16. This allows the backing plate 18 to be re-used. An indium bonding process can accomplish this aim of allowing de-bonding of the target 16 from the backing plate 18 to allow re-use of backing plate 18.

Insulating spacer ring 23 is position around the periphery of and coupled to backing plate 18. Insulating spacer ring 23 operates to electrically insulate backing plate 18 from the chamber walls 12 and magnetron assembly housing 34, both of which represent system ground. In the illustrated embodiment, insulating spacer ring 23 is constructed from a ceramic material and bonded to backing plate 18 and extender ring 24.

The bonding of ceramic spacer 23 to backing plate 18 and extender ring 24 is preferably performed at a higher temperature bonding process than the bonding of the target 16 to the backing plate 18. This higher bonding strength process will allow the ceramic spacer 23 to remain bonded when target 16 is de-bonded from backplate 16. In this way, the backing plate can de-bond from the target and be re-used without de-bonding the ceramic spacer from the backing plate or the extender ring. Repeated de-bonding of targets 16 from a backing plate 18 can create thermal stress at the ceramic spacer 23 bond. To limit this thermal stress, backing plate, extender ring and ceramic spacer should preferably be made from materials that do not have a significantly different thermal expansion coefficient. Furthermore, a relatively non-destructive bonding process should be used so that the bonds between the ceramic spacer 23 and the backing plate/extender ring can tolerate the thermal cycling.

In backing plate assembly 11, extender ring 24 is positioned around the periphery and coupled to insulating spacer ring 23. Extender ring 24 can couple directly to chamber walls 12, as shown. Extender ring 24 can be constructed from a metal material such as 300 series stainless steel or nickel plated aluminum. An ultra-high vacuum seal 25 provides a seal between extender ring 24 and chamber walls 12 suitable for creating an ultra-high vacuum in chamber 14. In the illustrated embodiment, seal 25 comprises a metal seal.

In one embodiment of the present invention, backing plate 18 serves as a cathode for creating plasma within chamber 14. To create a plasma cathode, electrically-conductive backing plate 18 can be coupled to either a D.C. source or a radio frequency (RF) source. Backing plate 18 can couple to the DC or RF energy source via conduit tubes 44. For example, FIG. 1 shows backing plate 18 connected to an RF source by means of an RF strap 68. Because the chamber walls 12 provide system ground, backing plate 18 must be electrically isolated from chamber walls 12 when backing plate 18 serves as a cathode. As previously discussed, insulating spacer ring 23 serves to electrically isolate backing plate 18 from the chamber walls 12. Thus, the use of a ceramic spacer ring 23 allows a metal extender 24 to contact chamber walls in order to provide a high vacuum seal for vacuum chamber 12 while allowing backing plate 18 to serve as a system cathode.

A magnet array assembly 20 is positioned above backing plate 18 and target 16, as shown. Magnet array assembly 20 provides the magnetron enhancement of physical vapor deposition in chamber 14. One embodiment of a magnet array assembly is disclosed and described in U.S. Pat. No. 5,248,402, the disclosure of which is incorporated herein by reference.

A coolant manifold 22 is positioned proximate backing plate 18 such that coolant manifold 22 connects to conduits 19. Coolant manifold 22 provides a coupling means for providing fluid communication to conduits 19 of backing plate 18. The structure of one embodiment of coolant manifold 22 is described in more detail below.

A bearing support 26 is positioned as shown and provides support for a bearing 27. In one embodiment of the present invention, bearing 27 is a KAYDON bearing, number KD100XPO. A first insulator ring 28, and a second insulator ring 30 support bearing support 26, while isolating bearing support 26 from electrical contact with metal chamber walls 12. For embodiments of the present invention that include energizing backing plate 18 to form a cathode, backing plate 18 and all associated structures (an example being the bearing support 26) must be electrically isolated from chamber walls 12. Insulator rings 28 and 30, made from a non-conductive, elastomer material, effectively isolate bearing support 26 (and therefore cathode backing plate 18) from ground (the chamber walls and the magnetron assembly housing).

An anode ring 32 is positioned inside chamber 14 along the upper inner edge of chamber wall 12 as shown. Anode ring 32 serves as an anode for system 10 and is grounded through contact with chamber wall 12. In one embodiment of the present invention, anode ring 32 is constructed from stainless steel. Anode ring 32 is electrically isolated from backing plate 18. This isolation can be accomplished either through use of an insulator or an open air space as shown in FIG. 1.

A magnetron assembly housing 34, in contact with chamber walls 12, is coupled to first and second insulator rings 28 and 30, opposite bearing support 26. Magnetron assembly housing 34 provides a housing for the entire magnetron assembly 35 which sits on top of chamber 14. A third insulator ring 36 is positioned between magnetron assembly housing 34 and bearing support 26 to electrically isolate bearing support 26 and backing plate 18 from magnetron assembly housing 34.

A bearing retainer 38 is coupled to bearing support 26 and provides, along with bearing support 26, the outer race for bearing 27. A magnet holder 40 couples to magnet array assembly 20 and provides part of an inner race for bearing 27 as well as supporting magnet array assembly 20. A spacer ring 42 is positioned proximate magnet holder 40 and provides the remaining portion of the inner race for bearing 27, as shown.

A plate 50 is coupled to magnet array assembly 20, and a plate 52 is coupled to magnetron assembly housing 34, as shown. A sealed rotating shaft 54 extends through plate 52 and is coupled to plate 50 to provide rotation of magnet array assembly 20. As shown, a ferrofluidic feed-thru 56 allows the shaft of sealed rotating shaft 54 to extend through magnet assembly housing 34 without compromising the seal. A coupling 58 connects rotating shaft 54 with shaft 60 of motor 62. In one embodiment of the present invention, coupling 58 comprises an OLDHAM coupling.

A number of fastening devices 70 are used to couple pieces of system 10 together, as shown. In the illustrated embodiment, fastening devices 70 comprise screws of various sizes, although other fastening devices could be used. In addition, various sealing devices 72 provide sealing of chamber 14 and of the inside of the magnetron assembly 35 from outside atmospheric pressure. In the illustrated embodiment, sealing devices 72 comprise elastomer seals, although other sealing devices could be used.

A conduit tube 44 extends through magnetron assembly housing 34, third insulator ring 36, bearing support 26, and into coolant manifold 22, as shown. Conduit tube 44 provides fluid communication to conduits 19 of backing plate 18. Conduit tube 44 couples to coolant manifold 22 to provide the ability to pump fluid into and out of cooling channels provided by conduits 19 of backing plate 18. In one embodiment of the present invention, there are eight conduit tubes 44 coupled to coolant manifold 22, as described in more detail below. An insulating jacket 46 electrically insulates conduit tube 44 from magnetron assembly housing 34, as shown.

In one embodiment of the present invention, conduit tube 44 is constructed from copper. Conduit tube 44 comprises a first end 96 and a second end 98. First end 96 is operable to connect to coolant manifold 22. Second end 98 is operable to provide fluid communication to inlet/out manifold 48 for either pumping of cooling fluid into or out of backing plate 18. In the embodiment of FIG. 1, four conduit tubes 44 (inlet conduit tubes) supply coolant, through coolant manifold 22, to conduits 19 in backing plate 18, while four conduit tubes 44 (outlet conduit tubes) receive coolant exiting from conduits 19 in backing plate 18. Insulating jacket 46 is constructed from insulating material to electrically isolate conduit tube 44 from magnet assembly housing 34.

In one embodiment of the present invention, the conduit tubes 44 couple to an electrical source such as an RF or DC source, to provide an energy path to backing plate 18. The energized backing plate then provides a cathode for the magnetron sputtering system 10. In the illustrated embodiment, an RF strap 68 is coupled to conduit tube 44 to provide an RF source to backing plate 18. In other embodiments, a DC source can couple to one or more conduit tubes 44 to provide a DC source for creation of plasma within chamber 14. Generally, a DC source is used where target 16 is a conductive material, and an RF source is used where target 16 is a semiconductor or insulating material.

An inlet/outlet manifold 48 is coupled to magnetron assembly housing 34. Inlet/outlet manifold 48 comprises inlets and outlets which are in fluid communication. Inlet/outlet manifold 48 is connectable in fluid communication with each conduit tube 44 and conduit 19 such that coolant can be pumped into and out of the cooling channels.

Figure 2:
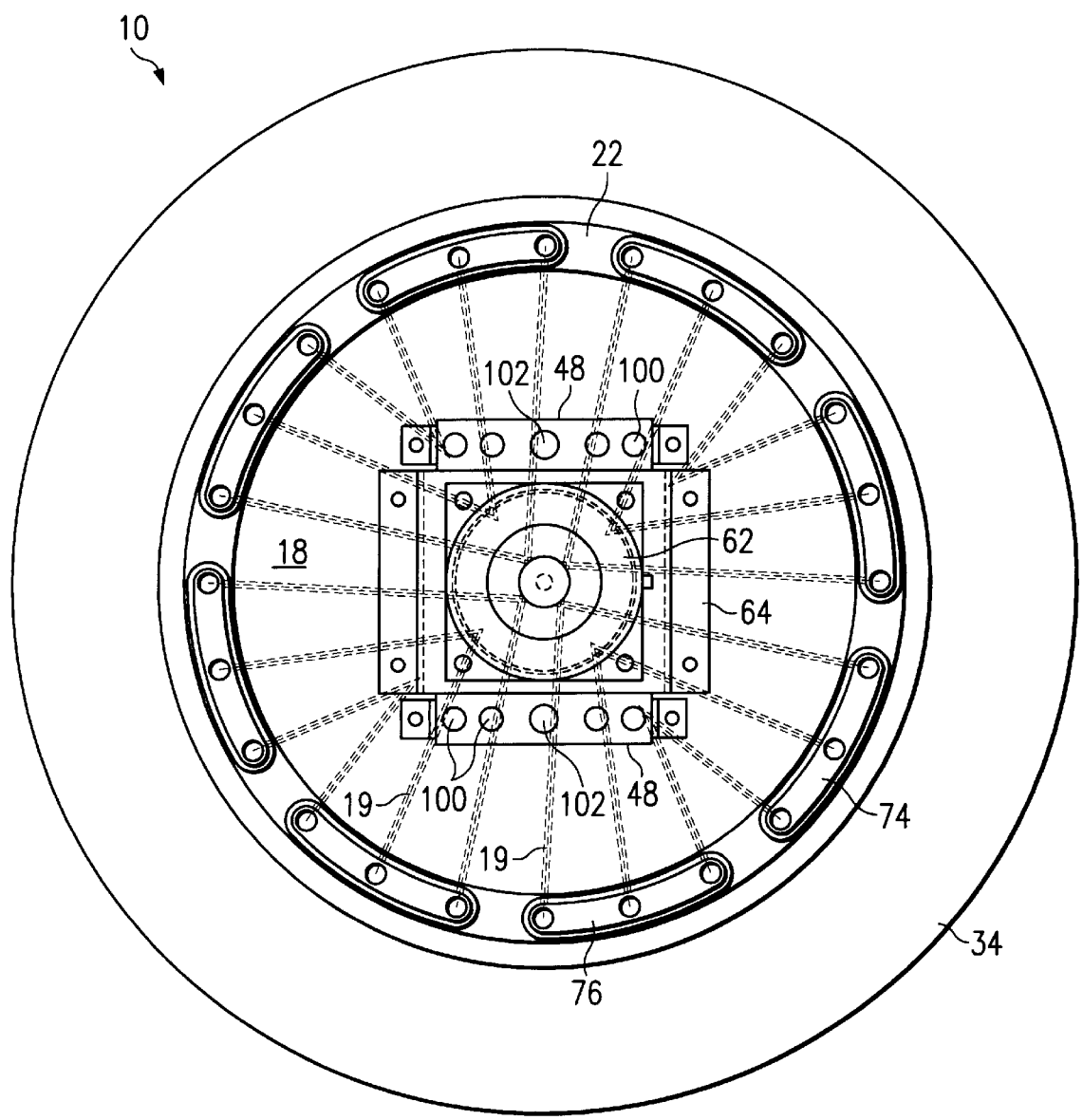
FIG. 2 is a top view of the magnetron sputtering system of FIG. 1.

In the illustrated embodiment of the present invention, inlet/out manifold 48 is constructed from aluminum and aluminum alloy as indicated. Inlet/out manifold 48 includes four conduit tube openings 100, and one inlet/outlet opening 102. Conduit tube openings 100 and inlet/outlet opening 102 are in fluid communication via conduit 104. Inlet openings 100 are operable to connect with four of conduit tubes 44. Outlet opening 102 is operable to connect in fluid communication with a pump for either pumping cooling fluid into or out of inlet/out manifold 48. As shown in the embodiment of FIG. 2, the system 10 includes two manifolds 48. One inlet/out manifold 48 (the inlet manifold) couples (by means of a tubing) to the four inlet conduit tubes 44, while the other inlet/out manifold 48 (the outlet manifold) couples to the four outlet conduit tubes 44 via conduit tube openings 100.

In operation, magnetron sputtering system 10 operates to sputter material from target 16 into chamber 14. A plasma is generated in chamber 14 such that physical vapor deposition of the material sputtered from target 16 occurs. Magnetron sputtering system 10 provides magnetron enhancement of the sputtering process.

During operation, the present invention allows an ultra-high vacuum to be created in vacuum chamber 14 to provide an enhanced deposition environment. A technical advantage of the present invention is the use of insulating spacer ring 23 between extender ring 24 and backing plate 18 that allows backing plate assembly 11 to extend to contact chamber walls 12. Due to spacer ring 23, backing plate 18 remains electrically isolated from chamber walls 12, while still allowing a metal to metal contact at the chamber walls (between the extender ring 24 and chamber walls 12). The extender ring 24 of backing plate assembly 11 allows the sealing of vacuum chamber 14 using an ultra-high vacuum seal 25, such as a metal seal suitable for creating an ultra-high vacuum inside vacuum chamber 14.

The present invention also provides for the use of a reduced thickness backing plate 18. According to the present invention, the magnetron assembly housing is formed to enclose the magnet array assembly 20 and form a space, or the magnet array chamber 37, within the magnetron assembly housing. Magnet array chamber 37 comprises the space within magnetron assembly 35 that lies above backing plate 18. In operation, the pressure within the magnet array chamber can be reduced to a pressure much lower than atmospheric pressure. This reduction in pressure can be accomplished by operating a pump through pump port 88 that connects to magnet array chamber 37. In one embodiment of the present invention, the lower pressure ranges from 10 to 100 Torr in the magnet array chamber 37. During operation, chamber 14 is a vacuum, the magnet array chamber 37 is at subatmospheric pressure, and the remainder of system 10 is at atmospheric pressure.

The backing plate 18 will, therefore, experience pressure in the vacuum chamber on the target side of the backing plate 18, while at the same time the backing plate 18 will experience pressure force from within the magnet array chamber 37 on the magnet array assembly side of the backing plate. According to the teachings of the present invention, backing plate 18 sees a lower pressure differential due to the decrease in pressure within the magnet array chamber 37. This decrease in pressure differential will decrease the deflection force on the backing plate 18. This allow backing plate 18 to be decreased in thickness without experiencing the level of buckling, bowing, and deflection that would occur if the backing plate saw a more severe pressure differential. A thinner backing plate provides less of a barrier to the magnetic field generated by magnet array assembly 20.

The reduction of the thickness of backing plate 18 provides enhanced penetration of the magnetic field generated by magnetic array assembly 20. This enhanced strength of the magnetic field increases the effectiveness of magnetron sputtering system 10, and provides increased deposition rates and better utilization of target 16. In addition, the provision of cooling channels and the pumping of cooling liquid into and out of magnetron assembly 35 provides enhanced target cooling during operation. In the illustrated embodiment, cooling channels are provided by conduits 19.

In operation, coolant flows into inlet/outlet manifold 48 through inlet/outlet opening 102 from a coolant source (not shown), flows via conduit 104 to conduit tube openings 100, and into inlet conduit tubes 44. The coolant then flows from inlet conduit tubes 44, through coolant manifold 22, into conduits 19 (serving as cooling channels) through inlet collection region 74. Coolant flows through conduits 19, exits backing plate 18 through outlet collector region 76, flows through coolant manifold 22, into the four outlet conduit tubes 44. Coolant flows through the four outlet conduit tubes 44 into the four conduit tube openings 100 of inlet/outlet manifold 48. The coolant then mixes in conduit 104 and exits inlet/outlet manifold 48 through inlet/outlet opening 102.

FIG. 2 is a top view of magnetron sputtering system 10 of FIG. 1. Backing plate 18 can include conduits 19 that provide cooling channels to cool target 16 during the sputtering process. FIG. 2 illustrates an arrangement of conduits 19 in backing plate 18 and connection of conduits 19 to coolant manifold 22. In the illustrated embodiment, twelve v-shaped conduits 19, each having an input end and an output end, are divided into eight groups which can include four input and four output groups. For example, collector region 74 and collector region 76 collect opposite ends of three pairs of connected conduits 19. Collector region 74 and collector region 76 can serve respectively as an inlet and as an outlet for coolant. Thus, for each set of three conduits 19, a coolant can flow into the conduits through inlet collector region 74, through the three v-shaped conduits 19, and exit through outlet collector region 76. As shown in FIG. 2, two manifolds 48 are positioned on either side of motor 62. One inlet/out manifold 48 can be connected in fluid communication with each inlet collector region 74, and the other inlet/out manifold 48 can be connected in fluid communication with each outlet collector region 76. In this manner, one inlet line is used to pump coolant fluid into and one outlet line is used to pump coolant fluid out of conduits 19 in backing plate 18.

The thickness of backing plate 18 can be substantially reduced due to the decrease in the pressure differential seen by backing plate 18 and the cooling of backing plate 18 using cooling channels such as conduits 19. This provides enhancement of the operation of magnetron sputtering system 10.

Figure 3B:
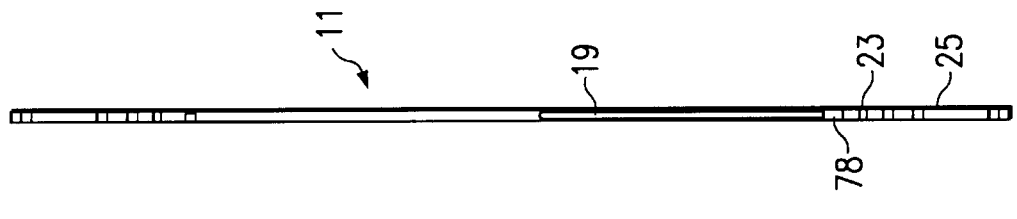
FIGS. 3A and 3B are a top and cross-sectional view of the backing plate assembly including the backing plate, spacer ring and extender ring of the present invention.
Figure 3A:
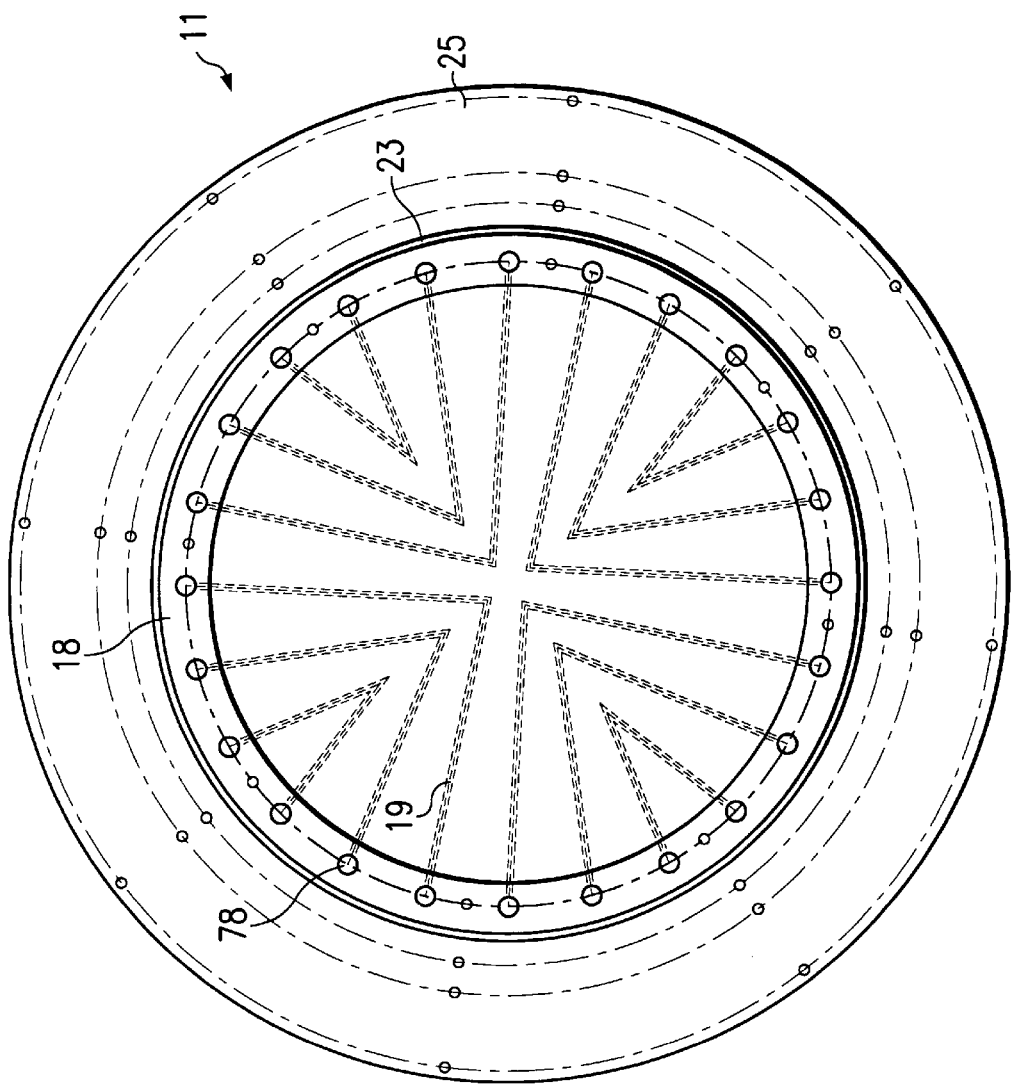

FIGS. 3A and 3B are top and cross-sectional views of the backing plate assembly 11 comprising backing plate 18, spacer ring 23 and extender ring 24. In the illustrated embodiment, spacer ring 23 is constructed from ceramic, and extender ring 24 is constructed from stainless steel. Spacer ring 23 can coupled to backing plate 18 and extender ring 24 according to a bonding process that provides a secure contact to backing plate 18 and will not debond when target 16 is removed from backing plate 18. In addition, thermal expansion of backing plate 18 and spacer ring 23 are preferably substantially similar to prevent problems caused by thermal cycling. Ceramic spacer ring 23 insulates backing plate 18 from extender ring 24. Therefore, the entire backing plate assembly 11 can be coupled to chamber walls 12 while electrically isolating backing plate 18 from chamber walls 12.

As shown in FIG. 3A, backing plate 18 comprises a number of conduits 19. In the illustrated embodiment, v-shaped conduits 19 are divided into four quadrants, with each quadrant having six holes 78 connecting to three conduits 19, respectively. In one embodiment of the present invention, conduits 19 are formed by drilling into backing plate 18 from the side. The conduits are then plugged and welded on the periphery, after which holes 78 are drilled from the top to connect to conduits 19. FIG. 3B shows the interconnection of holes 78 with conduits 19. In another embodiment of the present invention, conduits 19 are formed by cutting grooves in the top of backing plate 18 and mounting a plate over the grooves. Other suitable methods of forming conduits 19 are possible.

The present invention provides a cathode design with improved vacuum integrity for diode and magnetron PVD applications with ultra-high vacuum (UHV) base pressure requirements. In one embodiment of the present invention, the target backing plate is bonded to an electrically insulating ceramic ring. The ceramic ring is also bonded to a metallic extender ring which provides a vacuum seal to the process chamber top using a vacuum metal seal, vacuum elastomer seal, or other suitable vacuum seal. The two bonded ceramic-to-metal junctions are hermetically sealed for excellent vacuum integrity. This design isolates the backing plate 18 from the electrical ground without the use of elastomer seals between the insulator ring 23 and vacuum seal ring 25. The ceramic insert 23 bonded between backing plate 18 and extender ring (1) allows a metal-to-metal vacuum seal at the vacuum chamber wall 12, and (2) isolates an electrically charged backing plate from the chamber walls, both without using a weaker elastomeric insulator/seal. The present invention eliminates the need for any elastomeric seals to seal the vacuum chamber while electrically isolating the backing plate from the chamber walls. The chamber vacuum sees the backing plate, the ceramic spacer ring, the extender ring, and the ultra-high vacuum metal seal.

The thermal bonding or brazing process used on the target backing plate 18, spacer ring 23, and extender ring 21 structure employs a higher temperature bonding or brazing material compared to the indium bonding process used on the backing plate 18 and the target 16 junction. This ensures a reusable composite metal/ceramic/metal backing plate assembly 11 capable of surviving many new target bonding processes. The UHV cathode of the present invention is compatible with conventional cathode technology. The spacer ring 23 can be constructed from ceramic, alumina, aluminum nitride or other suitable insulating materials.

Although the present invention has been described in detail, it should be understood that various changes, substitutions and alterations can be made hereto without departing from the spirit and scope of the invention as defined by the appended claims.

What is claimed is:

1. A magnetron sputtering system for ultra-high-vacuum processing to sputter a material from a target onto a substrate contained within a vacuum chamber, comprising;

a magnet array assembly;

a magnet array chamber formed such that the magnet array chamber encloses the magnet array assembly;

a backing plate assembly forming a portion of the magnet array chamber on a first side and forming a portion of the vacuum chamber on a side opposite the first side, the backing plate assembly further comprising;

a backing plate;

an extender ring coupled to the vacuum chamber walls at the periphery of the extender ring;

an insulated spacer ring coupled between the backing plate and the extender ring to electrically isolate the backing plate from walls of the vacuum chamber;

a first bond between the insulated spacer ring and the backing plate to hermetically seal the insulated spacer ring to the backing plate and form a vacuum seal between the insulated spacer ring and the backing plate; and a second bond between the insulated spacer ring and the extender ring to hermetically seal the insulated spacer ring to the extender ring and form a vacuum seal between the insulated spacer ring and the extender ring; and a vacuum seal coupled to the extender ring and the walls of the vacuum chamber at the junction between the extender ring and the walls of the vacuum chamber, the vacuum seal capable of sealing the vacuum chamber to maintain a low base pressure vacuum state in the vacuum chamber.

2. The system of claim 1 wherein said first bond and said second bond are formed using a thermal bonding process.

3. The system of claim 1 wherein said first bond and said second bond are formed using a thermal brazing process.

4. The system of claim 1, wherein the first bond and said second bond are formed using an epoxy.

5. The system of claim 1, wherein the insulated spacer ring comprises a ceramic spacer ring.

6. The system of claim 5, wherein the ceramic spacer ring is constructed from aluminum nitride or aluminum oxide.

7. The system of claim 5, wherein the backing plate comprises an electrically conductive metal material and is electrically powered to provide a cathode for the sputtering system.

8. The system of claim 1, further comprising a pump port coupled to the magnet array chamber, the pump port operable to reduce a pressure in the magnet array chamber to decrease a pressure differential between the magnet array chamber and the vacuum chamber to reduce a deflection force on the backing plate produced by the pressure differential, thereby allowing the use of a reduced thickness backing plate.

9. The system of claim 1, wherein the insulated spacer ring comprises quartz.

10. The system of claim 1, wherein the target is coupled to the backing plate using a relatively low temperature bonding process to allow the backing plate to be de-bonded from the target when the target needs to be replaced to allow re-use of the backing plate.

11. The system of claim 10, wherein a ceramic spacer is positioned around the periphery of the backing plate and bonded to the backing plate which is formed from an electrically conductive metal material, and wherein the extender ring is formed from a metal material and is positioned around the periphery of the ceramic spacer and bonded to the ceramic spacer.

12. The system of claim 11, wherein said first bond between the ceramic spacer ring and the backing plate and said second bond between the ceramic spacer ring and the extender ring are formed using a relatively high strength bonding process capable of hermetic sealing to allow an ultra-high vacuum (UHV) to be established within the vacuum chamber.

13. The system of claim 12, wherein ceramic material comprising the ceramic spacer ring, the metal material comprising the extender ring, and the electrically conductive metal material comprising the backing plate have substantially equal thermal expansion coefficients.

14. The system of claim 1, wherein the target is coupled to the backing plate, and further wherein cooling channels are formed within the backing plate, the cooling channels operable to circulate a coolant to provide cooling to the target during sputtering operation.

15. The system of claim 14, further comprising a plurality of conduit tubes operable to provide coolant to the backing plate, the plurality of conduit tubes in fluid communication with the cooling channels.

16. The system of claim 15, further comprising;
a coolant manifold coupled to the backing plate and to the conduit tubes, the coolant manifold having at least one inlet collector through which coolant flows from a set of inlet conduit tubes into the cooling channels of the backing plate and at least one outlet collector through which coolant flows out of the backing plate cooling channels into a set of outlet conduit tubes.

17. The system of claim 16, further comprising;
a first inlet/outlet manifold coupled to the inlet conduit tubes, the first inlet/outlet manifold operable to receive coolant and transfer coolant to the inlet conduit tubes; and
a second inlet/outlet manifold coupled to the outlet conduit tubes, the second inlet/outlet manifold operable to receive coolant from the outlet conduit tubes after the coolant has been flowed through the cooling channels.

18. The system of claim 17, wherein the first and second inlet/outlet manifolds further comprise an inlet/outlet opening and a plurality of conduit tube openings in fluid communication via a conduit, and further wherein the target is cooled by having the coolant flow into the first inlet/outlet manifold through the inlet/outlet opening, into the conduit to the plurality of conduit tube openings, through the inlet conduit tubes to the coolant manifold, through the inlet collector of the coolant manifold into the cooling channels, through the cooling channels and exiting the backing plate through the outlet collectors, through the coolant manifold into the outlet conduit tubes, through the outlet conduit tubes into the conduit tube openings of the second inlet/outlet manifold, into the conduit and exiting the second inlet/outlet manifold through the inlet/outlet opening.

19. The system of claim 18, further comprising a plurality of conduit tubes, the conduit tubes operable to provide coolant to the backing plate, and the conduit tubes further operable to electrically connect the backing plate to an electrical source, thereby forming a cathode from the electrically charged backing plate.

20. The system of claim 19, wherein the electrical source is a DC source.

21. The system of claim 19, wherein the electrical source is an RF source.

22. A method for enhancing the vacuum integrity within a vacuum chamber in a magnetron sputtering system for sputtering a material from a target onto a substrate contained within the vacuum chamber, comprising;
forming a portion of the vacuum chamber with a backing plate assembly comprising a backing plate, an extender ring, and an insulated spacer ring;
coupling the extender ring to the vacuum chamber walls at the periphery of the extender ring;
positioning the insulated spacer ring between the backing plate and the extender ring to electrically isolate the backing plate from walls of the vacuum chamber;
forming a first hermetically sealed junction between said insulated spacer ring and said backing plate, wherein said first sealed junction is operable to maintain a vacuum in the vacuum chamber;
forming a second hermetically sealed junction between said insulated spacer ring and said extender ring, wherein said second sealed junction is operable to maintain a vacuum in the vacuum chamber; and
coupling the backing plate assembly to the walls of the vacuum chamber at the junction between the extender ring and the walls of the vacuum chamber with a vacuum seal capable of sealing the vacuum chamber to maintain a low-base-pressure vacuum state in the vacuum chamber.

23. The method of claim 22, wherein said first sealed junction and said second sealed junction are formed using a material selected from the group of materials comprising thermal bonding, thermal brazing, and epoxy.

24. The method of claim 22, further comprising;
forming the insulated spacer ring from a ceramic material;
forming the backing plate from an electrically conductive metal material; and
electrically powering the backing plate to provide a cathode for the sputtering system.

25. The method of claim 22, further comprising;
bonding a target to the backing plate using a relatively low temperature bonding process, thereby allowing the target to be de-bonded from the backing plate to allow re-use of the backing plate.

26. The method of claim 25, further comprising;
positioning the insulated spacer ring around the periphery of the backing plate;
bonding the insulated spacer ring to the backing plate to form a hermetically-sealed junction;
positioning the extender ring around the periphery of the insulated spacer ring; and bonding the insulated spacer ring to the extender ring to form a hermetically-sealed junction.

27. The method of claim 26, wherein the bonding of junctions between the ceramic spacer ring and the backing plate and the ceramic spacer ring and the extender ring further comprise using a relatively high strength bonding process capable of containing the vacuum within the vacuum chamber, and capable of withstanding the target bonding and de-bonding temperature.

28. The method of claim 22, further comprising;

forming cooling channels in a backing plate;

coupling the target to the backing plate; and flowing a coolant through the cooling channels during sputtering operation.

29. The method of claim 28, further comprising;

placing a plurality of conduit tubes in fluid communication with the cooling channels to provide coolant to the backing plate.

30. The method of claim 29, further comprising;

coupling a coolant manifold in fluid communication between the backing plate and the conduit tubes; and flowing coolant from the inlet conduit tubes to an inlet collector of the coolant manifold;

flowing coolant from the inlet collector of the coolant manifold into the cooling channels of the backing plate;

flowing coolant through the cooling channels to an outlet collector of the coolant manifold; and flowing coolant through the outlet collector of the coolant manifold into the outlet conduit tubes.

31. The method of claim 30, further comprising;

coupling a first inlet/outlet manifold to the inlet conduit tubes;

coupling a second inlet/outlet manifold to the outlet conduit tubes;

cooling the target by flowing coolant into the first inlet/outlet manifold through an inlet/outlet opening, into the conduit to a plurality of conduit tube openings, through the inlet conduit tubes to the coolant manifold, through the inlet collector of the coolant manifold into the cooling channels, through the cooling channels and exiting the backing plate through the outlet collectors, through the coolant manifold into the outlet conduit tubes, through the outlet conduit tubes into the conduit tube openings of the second inlet/outlet manifold, into the conduit and exiting the second inlet/outlet manifold through the inlet/outlet opening.

32. The method of claim 31, further comprising;

coupling the plurality of conduit tubes to an electrical source to electrically charge the backing plate to form a cathode.

33. A magnetron sputtering system for sputtering a material from a target onto a substrate contained within a vacuum chamber, comprising;

a magnet array assembly;

a magnet array chamber formed such that the magnet array chamber encloses the magnet array assembly;

a pump port coupled to the magnet array chamber, the pump port operable to reduce the pressure in the magnet array chamber to decrease a pressure differential between the magnet array chamber and the vacuum chamber to reduce the deflection force on a backing plate, thereby allowing the use of a reduced thickness backing plate; and a backing plate assembly forming a portion of the magnet array chamber on a first side and forming a portion of the vacuum chamber on a side opposite the first side, the backing plate assembly further comprising;

a backing plate, the backing plate comprising an electrically conductive metal material, the backing plate having a target coupled to it, the backing plate further having cooling channels to cool the target during sputtering operation;

an extender ring coupled to a wall of the vacuum chamber at the periphery of the extender ring; and an insulated spacer ring coupled between the backing plate and the extender ring to electrically isolate the backing plate from the wall of the vacuum chamber;

a first hermetically sealed junction between said insulated spacer ring and said backing plate, said first sealed junction operable to maintain a vacuum in the vacuum chamber;

a second hermetically sealed junction between said insulated spacer ring and said extender ring, said second sealed junction operable to maintain a vacuum in the vacuum chamber;

a vacuum seal coupled to the extender ring and the vacuum chamber wall at the junction between the extender ring and the vacuum chamber wall, the vacuum seal capable of sealing the vacuum chamber to maintain a low-base-pressure vacuum state in the vacuum chamber; and a plurality of conduit tubes, the conduit tubes in fluid communication with the backing plate to provide a coolant to the backing plate, and the conduit tubes further operable to electrically connect the backing plate to an electrical source, thereby electrically charging the backing plate to form a cathode;

wherein the extender ring comprises a metal material and the walls of the vacuum chamber comprise a metal material, and further wherein the vacuum seal between the extender ring and the walls of the vacuum chamber comprises a metal vacuum seal for reduced vacuum base pressure.

* * * * *